United States Patent
Mallik et al.

(10) Patent No.: US 11,417,630 B2
(45) Date of Patent: Aug. 16, 2022

(54) SEMICONDUCTOR PACKAGE HAVING PASSIVE SUPPORT WAFER

(71) Applicant: Intel Corporation, Santa Clara, CA (US)

(72) Inventors: Debendra Mallik, Chandler, AZ (US); Digvijay A. Raorane, Chandler, AZ (US); Ravindranath Vithal Mahajan, Chandler, AZ (US); Mitul Bharat Modi, Phoenix, AZ (US)

(73) Assignee: Intel Corporation, Santa Clara, CA (US)

(*) Notice: Subject to any disclaimer, the term of this patent is extended or adjusted under 35 U.S.C. 154(b) by 18 days.

(21) Appl. No.: 16/349,543

(22) PCT Filed: Dec. 29, 2016

(86) PCT No.: PCT/US2016/069308
§ 371 (c)(1),
(2) Date: May 13, 2019

(87) PCT Pub. No.: WO2018/125162
PCT Pub. Date: Jul. 5, 2018

(65) Prior Publication Data
US 2019/0287942 A1  Sep. 19, 2019

(51) Int. Cl.
*H01L 25/065* (2006.01)
*H01L 21/768* (2006.01)
(Continued)

(52) U.S. Cl.
CPC .......... *H01L 25/0655* (2013.01); *H01L 21/56* (2013.01); *H01L 21/76898* (2013.01);
(Continued)

(58) Field of Classification Search
CPC .......... H01L 25/0655; H01L 21/76898; H01L 23/3185; H01L 23/42; H01L 24/32;
(Continued)

(56) References Cited

U.S. PATENT DOCUMENTS

2006/0081978 A1* 4/2006 Huang ................ H01L 23/3114
257/706
2008/0283989 A1 11/2008 Jeung et al.
(Continued)

FOREIGN PATENT DOCUMENTS

KR  10-2008-0101256  11/2008

OTHER PUBLICATIONS

International Search Report and Written Opinion for International Patent Application No. PCT/US2016/069308 dated Sep. 28, 2017, 9 pgs.
(Continued)

*Primary Examiner* — Thanh Y. Tran
(74) *Attorney, Agent, or Firm* — Schwabe, Williamson & Wyatt, P.C.

(57) ABSTRACT

Semiconductor packages including passive support wafers, and methods of fabricating such semiconductor packages, are described. In an example, a semiconductor package includes a passive support wafer mounted on several active dies. The active dies may be attached to an active die wafer, and the passive support wafer may include a monolithic form to stabilize the active dies and active die wafer during processing and use. Furthermore, the passive support wafer may include a monolith of non-polymeric material to transfer and uniformly distribute heat generated by the active dies.

15 Claims, 6 Drawing Sheets

(51) Int. Cl.
*H01L 21/822* (2006.01)
*H01L 23/31* (2006.01)
*H01L 23/42* (2006.01)
*H01L 23/48* (2006.01)
*H01L 23/00* (2006.01)
*H01L 21/56* (2006.01)
*H01L 25/00* (2006.01)
*H01L 23/498* (2006.01)
*H01L 23/367* (2006.01)

(52) U.S. Cl.
CPC ...... *H01L 21/8221* (2013.01); *H01L 23/3185* (2013.01); *H01L 23/42* (2013.01); *H01L 23/481* (2013.01); *H01L 24/32* (2013.01); *H01L 25/0652* (2013.01); *H01L 25/50* (2013.01); *H01L 23/3128* (2013.01); *H01L 23/367* (2013.01); *H01L 23/49816* (2013.01); *H01L 23/49827* (2013.01); *H01L 2224/16225* (2013.01); *H01L 2225/06513* (2013.01); *H01L 2225/06541* (2013.01); *H01L 2225/06589* (2013.01); *H01L 2924/15311* (2013.01); *H01L 2924/181* (2013.01)

(58) Field of Classification Search
CPC . H01L 2225/06513; H01L 2225/06589; H01L 2924/15311; H01L 23/49816; H01L 23/367; H01L 23/3128
See application file for complete search history.

(56) References Cited

U.S. PATENT DOCUMENTS

| | | | |
|---|---|---|---|
| 2011/0233762 A1 | 9/2011 | Gruber et al. | |
| 2012/0309130 A1* | 12/2012 | Hin | H01L 21/6836 438/113 |
| 2014/0036454 A1 | 2/2014 | Caskey et al. | |
| 2014/0287553 A1* | 9/2014 | Lin | H01L 23/16 438/107 |
| 2015/0085169 A1* | 3/2015 | Igarashi | H04N 5/2254 348/294 |
| 2015/0357255 A1* | 12/2015 | Lin | H01L 21/56 257/712 |
| 2015/0357272 A1 | 12/2015 | Shen et al. | |
| 2016/0099206 A1 | 4/2016 | Margalit | |
| 2017/0194266 A1* | 7/2017 | Kwon | H01L 24/32 |
| 2018/0108592 A1* | 4/2018 | Hembree | H01L 21/563 |

OTHER PUBLICATIONS

International Preliminary Report on Patentability for international Patent Application No. PCT/US2016/069308, dated Jul. 11, 2019, 8 pages.

* cited by examiner

DETAIL A

A-A

SEMICONDUCTOR PACKAGE HAVING PASSIVE SUPPORT WAFER

CROSS-REFERENCE TO RELATED APPLICATION

This patent application is a U.S. National Phase Application under 35 U.S.C. § 371 of International Application No. PCT/US2016/069308, filed Dec. 29, 2016, entitled "SEMICONDUCTOR PACKAGE HAVING PASSIVE SUPPORT WAFER," which designates the United States of America, the entire disclosure of which is hereby incorporated by reference in its entirety and for all purposes.

TECHNICAL FIELD

Embodiments are in the field of integrated circuit packages and, in particular, semiconductor packages including active dies mounted on active die wafers.

BACKGROUND

A three-dimensional integrated circuit (3D IC) can include stacked silicon wafers and dies that interact with each other as an integrated circuit. For example, a silicon wafer and several silicon dies may be stacked and interconnected by through-silicon-vias (TSVs). 3D ICs can be incorporated in servers or workstations to power advanced computing applications. For example, 3D ICs can be used to run artificial-intelligence software for deep-learning applications.

DESCRIPTION OF EMBODIMENTS

Semiconductor packages including passive support wafers, and methods of fabricating such semiconductor packages, are described. In the following description, numerous specific details are set forth, such as packaging and interconnect architectures, in order to provide a thorough understanding of embodiments. It will be apparent to one skilled in the art that embodiments may be practiced without these specific details. In other instances, well-known features, such as specific semiconductor fabrication processes, are not described in detail in order to not unnecessarily obscure embodiments. Furthermore, it is to be understood that the various embodiments shown in the Figures are illustrative representations and are not necessarily drawn to scale.

Existing three-dimensional integrated circuit (3D IC) structures have several design challenges. For example, the above-mentioned aspects of some 3D ICs, i.e., the presence of TSVs in 3D IC wafers and the use of 3D ICs in certain high-speed applications, have natural consequences. First, TSVs may require the active wafers to be thinned to reduce signal path length, which can weaken the wafers and increase a risk of mechanical failure of a semiconductor package during manufacturing or use. Second, high-speed applications can generate heat that can be trapped in a stacked structure, and thus, hot spots may develop on the dies, which can increase a risk of thermal failure of the semiconductor package. Accordingly, wafer breakage and die overheating are challenges faced by existing 3D IC structures.

In an aspect, a semiconductor package, e.g., a 3D IC, includes a passive support wafer to enhance structural and thermal performance of the semiconductor package. The passive support wafer may be attached to active dies and/or active die wafers of the 3D IC to reinforce the active die wafer. For example, the passive support wafer may include a monolith of material having material strength greater than the active dies and active die wafer to provide stress relief to the other components of the 3D IC, and to reduce a risk of mechanical failure of the semiconductor package. The passive support wafer may be thermally coupled to the active dies to conduct heat away from the active dies and/or the active die wafer. For example, the passive support wafer may include a monolith of non-polymeric material attached to the active dies by a thin bonding layer. The non-polymeric material, e.g., copper, may distribute heat over an entire profile surface area of the 3D IC, and thus, may reduce a risk of thermal failure of the semiconductor package. Accordingly, the passive support wafer may increase a structural strength and thermal performance of the semiconductor package. Furthermore, as described below, the increased structural strength may facilitate manufacturing operations to be performed without using carrier substrates, and thus, a complexity and cost of manufacturing a 3D IC may be reduced.

Figure 1:
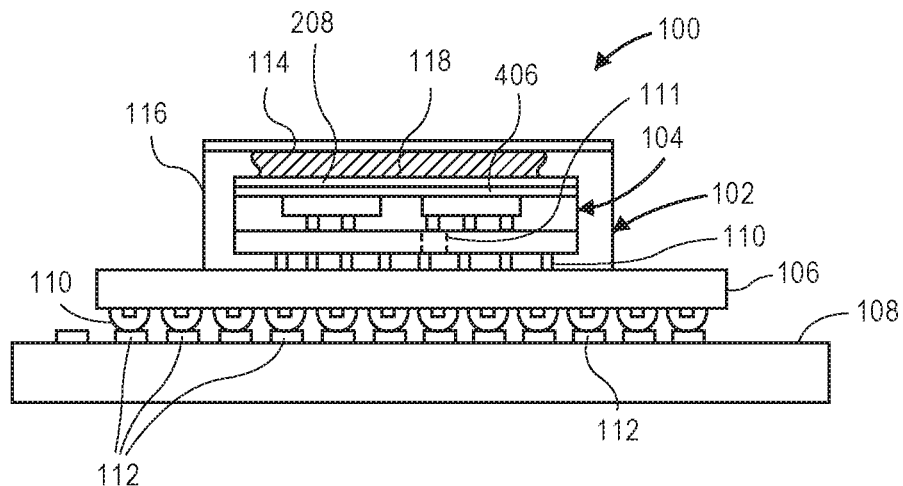
FIG. 1 illustrates a sectional view of a semiconductor package assembly, in accordance with an embodiment.

Referring to FIG. 1, a sectional view of a semiconductor package assembly is illustrated in accordance with an embodiment. A semiconductor package assembly 100 may include one or more semiconductor packages 102 having integrated circuit(s) 104. For example, one or more 3D ICs may be incorporated in semiconductor package 102, and may be in communication with each other and/or external components of a computing system. Integrated circuit 104 may include active dies mounted on an active die wafer, and the die stack may be fortified by a passive support wafer 208, as described below.

Integrated circuit(s) 104 may be electrically connected to external components by intervening structures. For example, semiconductor package 102 may include a package substrate 106, and integrated circuit 104 may be mounted on package substrate 106. Furthermore, package substrate 106 may in turn be mounted on a printed circuit board 108. Accordingly, semiconductor package assembly 100 may include semiconductor package 102 mounted on printed circuit board 108.

Electrical interconnections between integrated circuit 104, package substrate 106, and printed circuit board 108 may include solder balls 110 and or other metallic bump interconnects. More particularly, semiconductor package 102 of semiconductor package assembly 100 may be a ball grid array (BGA) component having several solder balls 110 arranged in a ball field. That is, an array of solder balls 110 may be arranged in a grid or other pattern. Each solder ball 110 may be mounted and attached to a corresponding contact pad 112 of printed circuit board 108. Printed circuit board 108 may be a motherboard or another printed circuit board of a computer system or device, e.g., a server or a workstation. Circuit board 108 may include signal routing to external device connectors (not shown). Accordingly, the solder ball and contact pad attachments may provide a physical and electrical interface between integrated circuit(s) 104 of semiconductor package 102 and an external device.

Integrated circuit 104 of semiconductor package 102 may include other electrical interconnections to components of semiconductor package assembly 100. For example, integrated circuit 104 may be electrically connected to package substrate 106 and/or printed circuit board 108 through one or more electrical interconnects, such as a through-silicon-via 111. By way of example, a TSV 111 may extend through an active die wafer of integrated circuit 104, as described below. Similarly, a vertical interconnect may extend through package substrate 106 to electrically connect integrated circuit 104 to printed circuit board 108.

Integrated circuit 104 may be thermally connected to other components of semiconductor package assembly 100. For example, integrated circuit 104 may include a passive support wafer 208, as described at length below, which may be connected to dies of integrated circuit 104 by a bonding layer 406, also described at length below. Passive support wafer 208 may be thermally connected to a heat spreader 114 of semiconductor package assembly 100. Passive support wafer 208 is distinct from heat spreader 114, however, as described below.

Heat spreader 114 may be attached to a package cover 116 of semiconductor package 102, or a different structure of a computer system. Alternatively, package cover 116 can be part of heat spreader 114, as is known in the art. Heat spreader 114 may be, for example, an aluminum plate having a thickness of at least 1 mm, e.g., 2-3 mm, as is known in the art. Thus, heat spreader 114 may be readily distinguished from the passive support wafer 208 of integrated circuit 104, as described below, in both material and size. Nonetheless, heat spreader 114 may be disposed over the passive support wafer 208 of integrated circuit 104, and may be thermally coupled to the passive support wafer 208 by a thermal interface layer 118. Thermal interface layer 118 may include a thermal interface material having low adhesive strength and a thickness of 30-40 µm, as is known in the art. Thus, thermal interface layer 118 may be readily distinguished from a bonding layer of integrated circuit, as described below, in both material and size. Thermal interface layer 118 may be between heat spreader 114 and the passive support wafer 208 to thermally couple heat spreader 114 to the passive support wafer 208, and more particularly, to conduct heat generated by active dies of integrated circuit 104 from the passive support wafer 208 to heat spreader 114.

Figure 2:
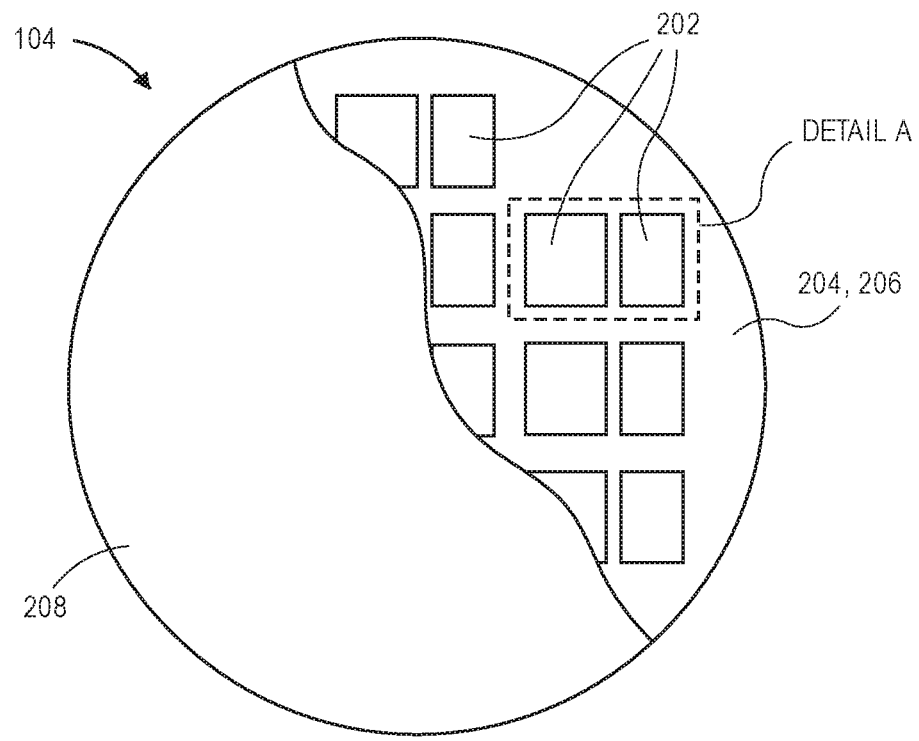
FIG. 2 illustrates a top view of a semiconductor package including a passive support wafer, in accordance with an embodiment.

Referring to FIG. 2, a top view of a semiconductor package including a passive support wafer is shown in accordance with an embodiment. Integrated circuit 104 of semiconductor package 100 may include a stacked structure. In an embodiment, the stacked structure includes several active dies 202 mounted on an active die wafer 204. For example, active die wafer 204 may have a top surface 206, and active dies 202 may be mounted on top surface 206. Similarly, integrated circuit 104 may include a passive support wafer 208 mounted on the active dies 202. For example, passive support wafer 208 may be attached to one or more of active dies 202 and/or active die wafer 204 over top surface 206.

The term "active" as used for active dies 202 and active die wafer 204 may be distinguished from the term "passive" as used for passive support wafer 208. More particularly, active components of integrated circuit 104 may include semiconductor material, e.g., silicon, incorporating one or more electronic circuits having electronic functionalities. By contrast, passive components of integrated circuit 104 may or may not include semiconductor material, however, the passive components do not have electronic functionality. For example, passive support wafer 208 may have a structural and/or thermal function, and may not include functional dies having electronic functionality.

Figure 3:
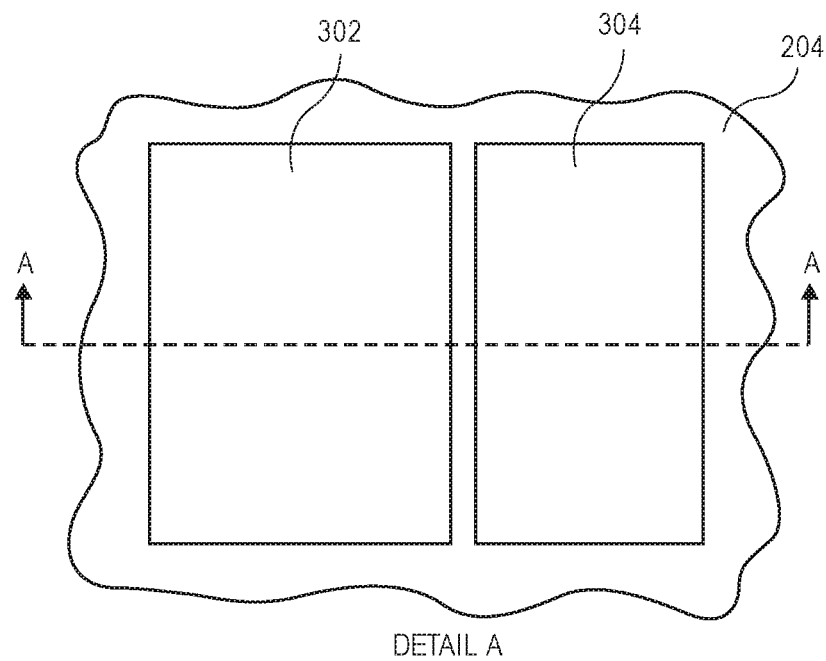
FIG. 3 illustrates a detail view of several active dies mounted on an active die wafer of a semiconductor package, in accordance with an embodiment.

Referring to FIG. 3, a detail view of several active dies mounted on an active die wafer of a semiconductor package is shown in accordance with an embodiment. In an embodiment, integrated circuit 104 includes at least two active dies 202, which have advanced electronic functions, mounted on active die wafer 204 having a carrier function. For example, active dies 202 may include a first active die 302 mounted on active die wafer 204 at adjacent to a second active die 304. First active die 302 and second active die 304 may have respective shapes or sizes. For example, first active die 302 and second active die 304 are depicted as rectangular dies in FIG. 3, and first active die 302 has a larger die profile than second active die 304. Similarly, first active die 302 and second active die 304 may have similar or different electronic functions. In an embodiment, first active die 302 and second active die 304 are advanced node chips, e.g., chips made using a 10 nanometer technology node. By contrast, active die wafer 204 may include chips made using prior technology nodes, e.g., memory controllers or chips serving I/O transfer control functions. In an embodiment, active die wafer 204 may act as an I/O transmission chip to facilitate data transmission between first active die 302 and second active die 304, and/or between active dies 202 and printed circuit board 108. For example, first active die 302 may communicate electrical signals to second active die 304 through electrical interconnects of active die wafer 204, e.g., electrical traces 604 or TSVs 111. Accordingly, active dies 202 and active die wafer 204 may complement the function of each other.

First active die 302 and second active die 304 may have different die functions and sizes. For example, first active die 302 and second active die 304 may have different thicknesses, despite being shown as having a same thickness in the figures. Furthermore, active dies 302, 304 may have any die function, including modem and memory functions. For example, active die 302 may be a modem die and active die 304 may be a memory die.

Figure 4:
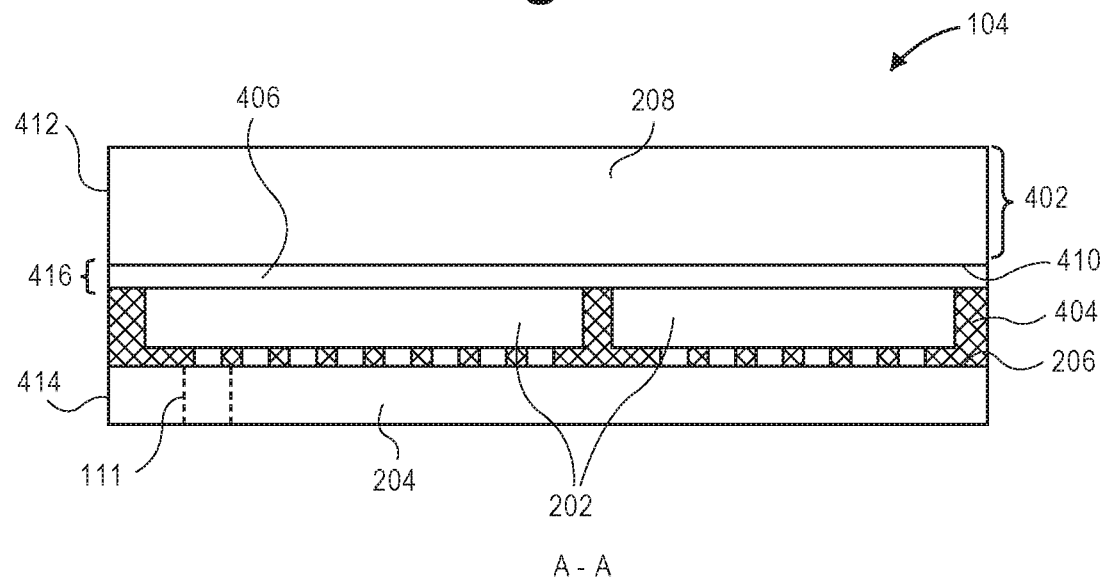
FIG. 4 illustrates a sectional view, taken about line A-A of FIG. 3, of a semiconductor package assembly including a passive support wafer, in accordance with an embodiment.

Referring to FIG. 4, a sectional view, taken about line A-A of FIG. 3, of a semiconductor package assembly including a passive support wafer is shown in accordance with an embodiment. To facilitate the formation of TSVs 111 on active die wafer 204, active die wafer 204 may be thin. For example, a thickness of active die wafer 204 may be between 20-80 µm based on limitations of TSV 111 formation. That is, the thickness may be limited to ensure that TSVs 111 can be formed as needed. Accordingly, active die wafer 204 may be formed from a thin wafer of silicon and may be fragile.

In an embodiment, passive support wafer 208 of integrated circuit 104 is fabricated to have a form and shape to fortify active die wafer 204. More particularly, passive support wafer 208 may be a monolith of a material, and the monolith may have higher bending strength than active die wafer 204. Bending strength of a wafer may be increased both through material choice and wafer size. In an embodiment, passive support wafer 208 is a monolith of a non-polymeric material having a higher material strength than silicon. For example, the non-polymeric material may be a metal, a ceramic, a synthetic diamond, or a combination thereof. The non-polymeric material of passive support wafer 208 may be selected based on structural properties, e.g., coefficient of thermal expansion, Young's modulus, ultimate tensile strength, etc., thermal conductivity, and cost. In an embodiment, the structural properties and thermal conductivity of the non-polymeric material may be better than the corresponding properties of silicon. That is, the non-polymeric material may be stronger than silicon.

Suitable metals for forming passive support wafer 208 include copper and aluminum, to name only a few. Metal is a low-cost non-polymeric material having good thermal conduction.

In the case of synthetic diamond, the non-polymeric material may be a diamond produced by a chemical vapor deposition (CVD) crystal formation method. CVD diamond can provide very high thermal conductivity, e.g., twice the thermal conductivity of copper. In an embodiment, passive support wafer 208 includes copper, or a similar metal, plated on a surface of a CVD diamond wafer. The composite structure may be used to tailor the wafer properties, e.g., CTE and strength. Accordingly, passive support wafer 208 may include a monolithic core of a first material surrounded by a coating or shell of a second material.

Passive support wafer 208 may be a monolith of silicon. Silicon has good thermal conduction, and may be structurally suitable when the monolith is sized to be stronger than active die wafer 204. For example, passive support wafer 208 may have a passive support wafer thickness 402 that is thicker than active die wafer 204. In an embodiment, passive support wafer thickness 402 is at least 20 µm. Passive support wafer thickness 402 may be less than a thickness of heat spreader 114. For example, passive support wafer thickness 402 may be less than 1 mm, e.g., 100-500 µm. Accordingly, passive support wafer 208 may strengthen integrated circuit 104 without substantially increasing an overall thickness of the stacked structure.

Passive support wafer 208 may be a continuous, monolithic layer of material placed over active dies 202 to strengthen an overall structure of integrated circuit 104. The term monolithic may be used to describe passive support wafer 208 being formed from a single piece of material without joints or seams. More particularly, passive support wafer 208 may be a rigid whole of a homogeneous material. Accordingly, mechanical and thermal properties of passive support wafer 208 may be uniform throughout and entirety of the wafer.

In an embodiment, an epoxy layer 404 may surround active dies 202 to form an intermediate portion of integrated circuit 104 between passive support wafer 208 and active die wafer 204. For example, a mold material or a polymer epoxy (FIG. 6C) may underfill a space between active dies 202 and active die wafer 204, and the polymer epoxy may surround sides of active dies 202. Accordingly, a top surface 206 of the epoxy layer 404 may be coplanar with a top surface 206 of active dies 202. That is, the intermediate portion of integrated circuit 104 may include exposed surfaces of active dies 202 an epoxy layer 404 facing upward away from active die wafer 204.

Integrated circuit 104 may include a bonding layer 406 covering the intermediate portion. For example, bonding layer 406 may include a die attach adhesive or a solder material laminated or otherwise disposed across the exposed surfaces of active dies 202 and epoxy layer 404. Passive support wafer 208 may be mounted on bonding layer 406, and attached to active dies 202 and/or epoxy layer 404 by an adhesive or solder joint. Accordingly, bonding layer 406 may be between, and in contact with, active dies 202, epoxy layer 404, and passive support wafer 208 of integrated circuit 104. As such, epoxy layer 404 may be between bonding layer 406 and active die wafer 204.

The intermediate portion of integrated circuit 104 may be disposed between a top surface 206 of active die wafer 204 and a bottom surface 410 of passive support wafer 208. That is, bottom surface 410 of passive support wafer 208 may face top surface 206 of active die wafer 204, and thus, the intermediate portion having bonding layer 406, epoxy layer 404, and active dies 202 may be sandwiched between the passive upper wafer and the active lower wafer of integrated circuit 104. In an embodiment, passive support wafer 208 includes a support wafer edge 412 extending around a perimeter of the wafer. Accordingly, support wafer edge 412 may define a profile of bottom surface 410. That is, a projection of support wafer edge 412 may define a perimeter of bottom surface 410, i.e., a support wafer profile. Similarly, active die wafer 204 may include an active wafer edge 414 extending around a perimeter of the wafer. Accordingly, active wafer edge 414 may define a profile of top surface 206. That is, a projection of active wafer edge 414 may define a perimeter of top surface 206, i.e., an active wafer profile.

In an embodiment, top surface 206 and bottom surface 410 have a same profile. For example, the profiles defined by active wafer edge 414 and passive wafer edge may have a same shape and/or a same size. By way of example, referring again to FIG. 2, the edges may define circular profiles having a same diameter. That is, bottom surface 410 of passive support wafer 208 and top surface 206 of active die wafer 204 may both be flat circular surfaces having a same surface area. Accordingly, passive support wafer 208 may provide structural support across an entirety of active die wafer 204.

One or more of bonding layer 406 and passive support wafer 208 may conduct and dissipate heat away from active dies 202. For example, bonding layer 406 may be spread over the entire exposed surface of active dies 202 and epoxy layer 404, and may physically separate passive support wafer 208 from epoxy layer 404 and active dies 202. As such, bonding layer 406 may thermally couple passive support wafer 208 to active dies 202. Accordingly, bonding layer 406 and/or passive support wafer 208 may have good thermal conductivity to facilitate heat transfer.

The thermal conductivity of the components of integrated circuit 104 may be enhanced by a size and a material of the respective components. In the case of bonding layer 406, bonding layer 406 may be formed from a die attach adhesive. Die attach adhesive may include a material typically used for attaching wires to dies, and may have good thermal conductivity. Furthermore, the adhesive of bonding layer 406 may have high adhesive strength, e.g., as compared to thermal interface material used between heat spreader 114 and integrated circuit 104 of semiconductor package 100. Accordingly, bonding layer 406 may be thin. By way of example, bonding layer 406 may include a bonding layer thickness 416 in a range of 10-20 µm. Such a thickness may be compared to a typical thickness of thermal interface layer 118 in a range of 30-40 µm. The relatively thin bonding layer 406 may enhance heat transfer away from hot spots on active dies 202 into the adjacent passive support wafer 208.

As described above, passive support wafer 208 may be formed from a monolithic non-polymeric material, such as copper, that can conduct heat effectively when passive support wafer thickness 402 is in a range of 100-500 μm. The monolithic nature of passive support wafer 208 construction enhances heat transfer away from regions of bonding layer 406 over hot spots on active dies 202. Accordingly, bonding layer 406 and passive support wafer 208 cooperate to distribute heat generated locally on active dies 202 across an entire surface area of integrated circuit 104. Thus, a peak heat flux density at an interface between integrated circuit 104 and heat spreader 114 may be suppressed or minimized.

Figure 5:
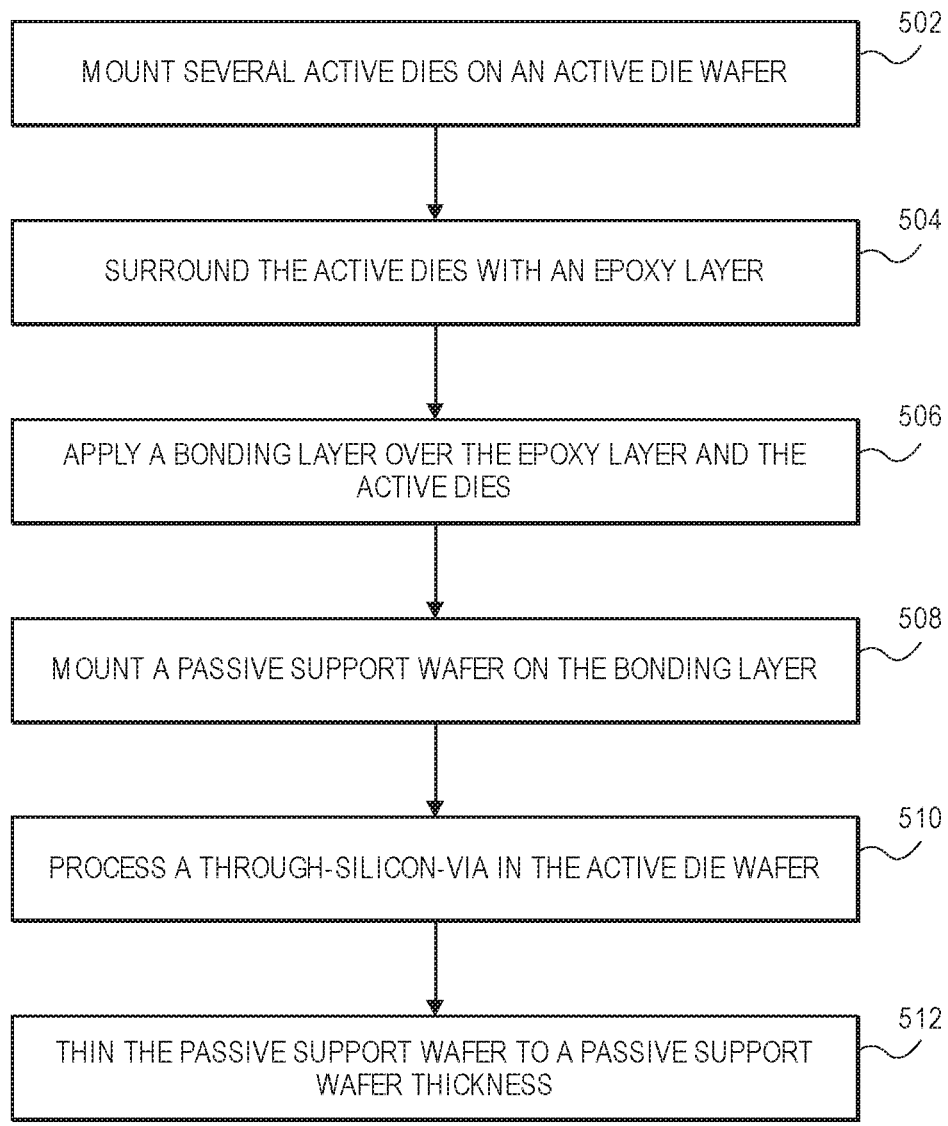
FIG. 5 illustrates a flowchart of a method of fabricating a semiconductor package including a passive support wafer, in accordance with an embodiment.
Figure 6A:
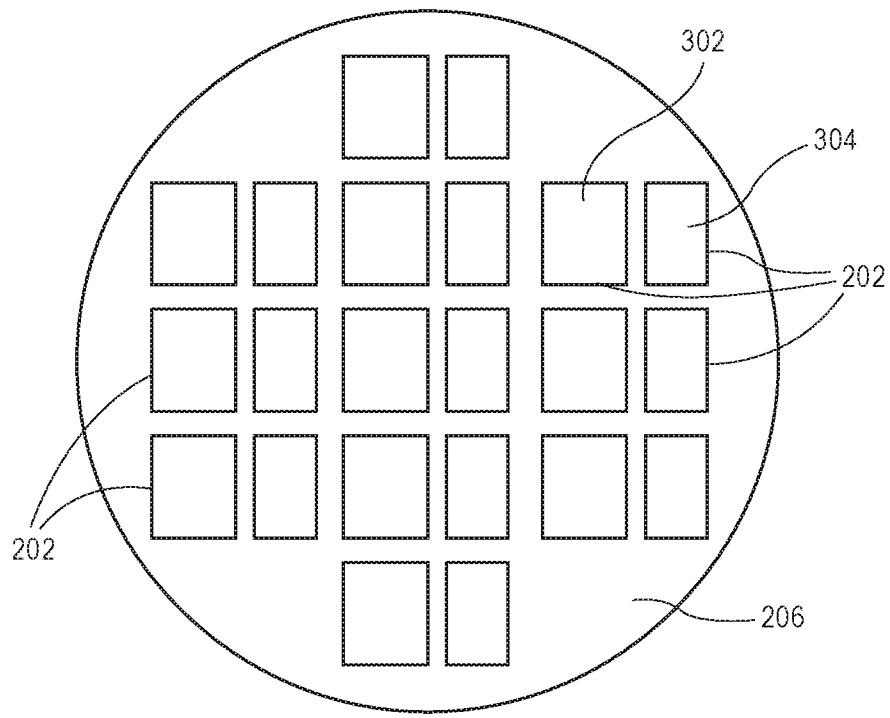
FIGS. 6A-6E illustrate operations in a method of fabricating a semiconductor package including a passive support wafer, in accordance with an embodiment.
Figure 6B:
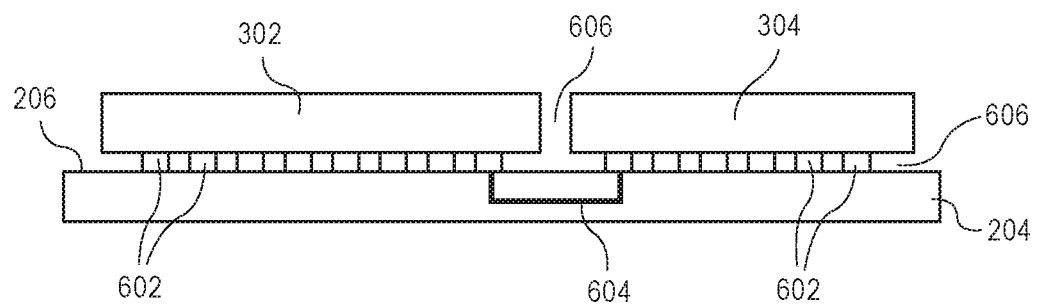
Figure 6C:
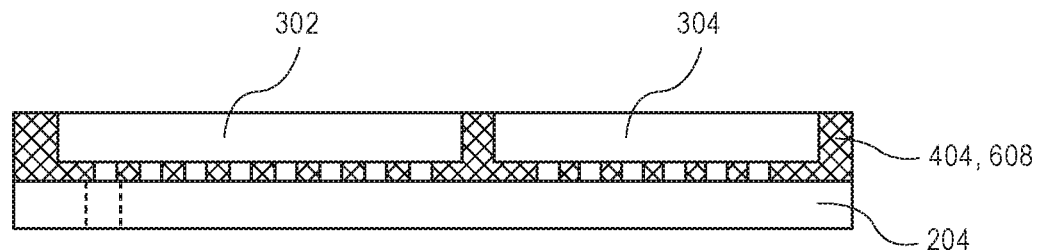
Figure 6D:
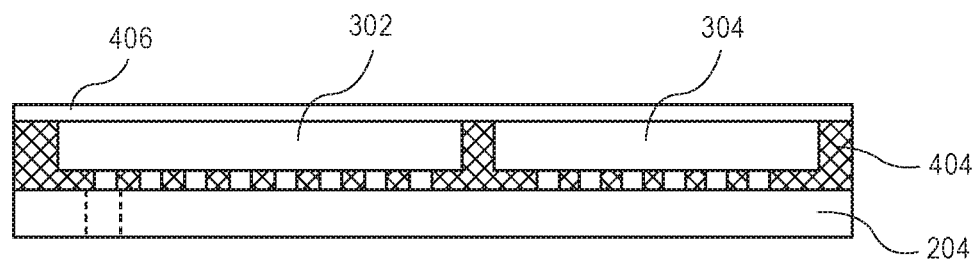
Figure 6E:
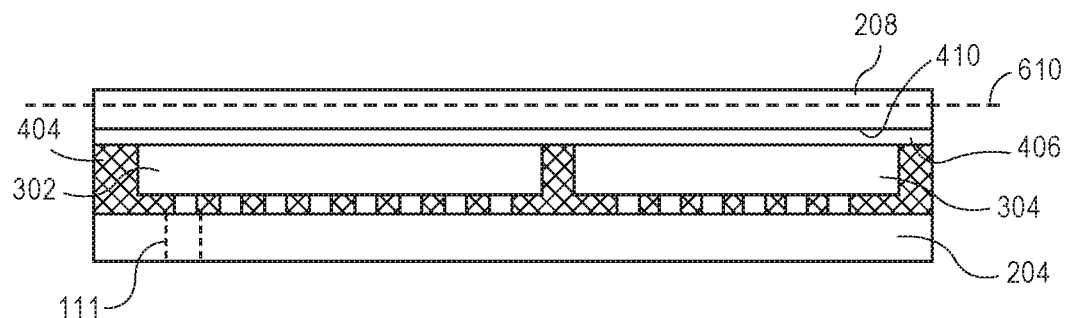

Referring to FIG. 5, a flowchart of a method of fabricating a semiconductor package including a passive support wafer is shown in accordance with an embodiment. FIGS. 6A-6E illustrate operations of the method of FIG. 5, and thus, FIGS. 5-6E are described in combination below.

At operation 502, several active dies 202 are mounted on active die wafer 204. Active dies 202 may be singulated from a silicon die wafer, as is known in the art. Referring to FIG. 6A, active dies 202 may be distributed uniformly or in an apparently random manner across top surface 206. Referring to FIG. 6B, active dies 202 may be soldered to electrical interconnects, e.g., contact pads 112, on active die wafer 204 by solder bumps 602. Accordingly, first active die 302 may be placed in electrical communication with second active die 304 through active die wafer 204, e.g., via an electrical trace 604. The stacked structure may include one or more gaps 606 between adjacent active dies 202 and between active dies 202 and top surface 206 of active die wafer 204.

At operation 504, active dies 202 are surrounded by epoxy layer 404. Referring to FIG. 6C, a polymer epoxy 608 may underfill gaps 606 between the undersides of active dies 202 and top surface 206 of active die wafer 204. Similarly, the polymer epoxy 608 may fill lateral gaps 606 between active dies 202, e.g., between first die and second die. After encapsulating active dies 202 with the polymer epoxy 608, a thickness of epoxy layer 404 and/or active dies 202 may be modified. For example, material may be removed from epoxy layer 404 and active dies 202 in a grinding process to reduce the thickness of the components to a predetermined dimension. Accordingly, a 3D IC may be formed having a two-layer construction, i.e., active dies 202 and epoxy layer 404 in a first stack layer and active die wafer 204 in a second stack layer.

At operation 506, bonding layer 406 is applied over epoxy layer 404 and active dies 202 of the 3D IC. More particularly, an adhesive or solder may be dispensed, deposited, flowed, or otherwise placed over active dies 202 and/or epoxy layer 404. As described above, bonding layer 406 may have a thickness in a range of 10-20 microns.

In an embodiment, passive support wafer 208 is a silicon wafer, and is bonded to an underlying silicon wafer. For example, an intermediate silicon wafer may be disposed on epoxy layer 404 and/or epoxy layer 404 may be a silicon layer (despite being termed an epoxy layer herein). Accordingly, a direct silicon-to-silicon bond may be formed between passive support wafer 208 and epoxy layer 404, or an intermediate silicon structure. It will be appreciated that, when the materials of passive support wafer 208 or epoxy layer 404 are varied, other bonding processes may be used to form bonding layer 406. For example, anodic bonding may be used to form bonding layer 406 between passive support wafer 208 and epoxy layer 404, i.e., when one of the structures is a glass material and the other one of the structures is a metal or a silicon material.

Passive support wafer 208 may be directly bonded to an underlying structure, e.g., epoxy layer 404, using other processes that do not require an adhesive layer in between the structures. For example, passive support wafer 208 may include a metal, e.g., copper, surface that can be bonded to a corresponding metal surface. By way of example, an upper surface of the active dies may have a metal coating and passive support wafer 208 may be fabricated from a compatible metal such that the active dies may bond directly to passive support wafer 208 without an intermediate adhesive layer.

At operation 508, passive support wafer 208 is mounted on bonding layer 406. For example, passive support wafer 208 may be placed on bonding layer 406. When bonding layer 406 incorporates an adhesive, pressure may be applied to cause passive support wafer 208 to adhere to bonding layer 406, and thus, to attach to active die wafer 204 through epoxy layer 404 and active dies 202. Accordingly, passive support wafer 208 may be mounted on active dies 202. Mounting of passive support wafer 208 on active dies 202 may occur before or after processing active die wafer 204 to form electrical interconnects on active die wafer 204.

Integrated circuit 104 having passive support wafer 208 may be processed further without the need to use a carrier substrate. For example, at operation 510, TSV 111 in active die wafer 204 may be processed after mounting passive support wafer 208 on active dies 202. Processing of TSV 111, e.g., processing integrated circuit 104 to reveal a built-in TSV 111, may be performed without a carrier substrate because passive support wafer 208 may provide the necessary structural support. That is, passive support wafer 208 can provide enough structural strength to allow active die wafer 204 to be processed without a carrier. Additional processing of integrated circuit 104 with an intact passive support wafer 208 can include copper plating and solder bumping. Accordingly, semiconductor package 100 having passive support wafer 208 may eliminate process complexities such as bonding and D bonding a carrier substrate, resulting in reduced manufacturing costs.

At operation 512, passive support wafer 208 may be thinned to passive support wafer thickness 402. Thinning may be performed before and/or after additional processing of active die wafer 204 has been completed. For example, thinning passive support wafer 208 to passive support wafer thickness 402 may be performed after the TSV 111 reveal process to maximize an amount of structural support provided by passive support wafer 208 during the reveal process. Referring to FIG. 6E, thinning of passive support wafer 208 may include grinding an upper surface of passive support wafer 208 to remove material up to a removal plane 610. A vertical distance between removal plane 610 and bottom surface 410 of passive support wafer 208 may define passive support wafer thickness 402. As described above, passive support wafer thickness 402 may be thinned to a predetermined dimension less than 1 mm, e.g., 100-500 μm.

In an embodiment, integrated circuit 104 fabricated according to the method described above may be singulated into several portions. For example, after singulated active dies 302, 302 are mounted on active die wafer 204 and then covered by passive support wafer 208, the sandwich structure may be singulated to form several integrated circuits 104, e.g., a first integrated circuit having a first set of active dies mounted between a first active die wafer and a first passive die wafer, and a second integrated circuit having a second set of active dies mounted between a second active die wafer and a second passive die wafer. The separate integrated circuits may then be mounted on respective package substrates 106 to form respective semiconductor package assemblies 100.

Figure 7:
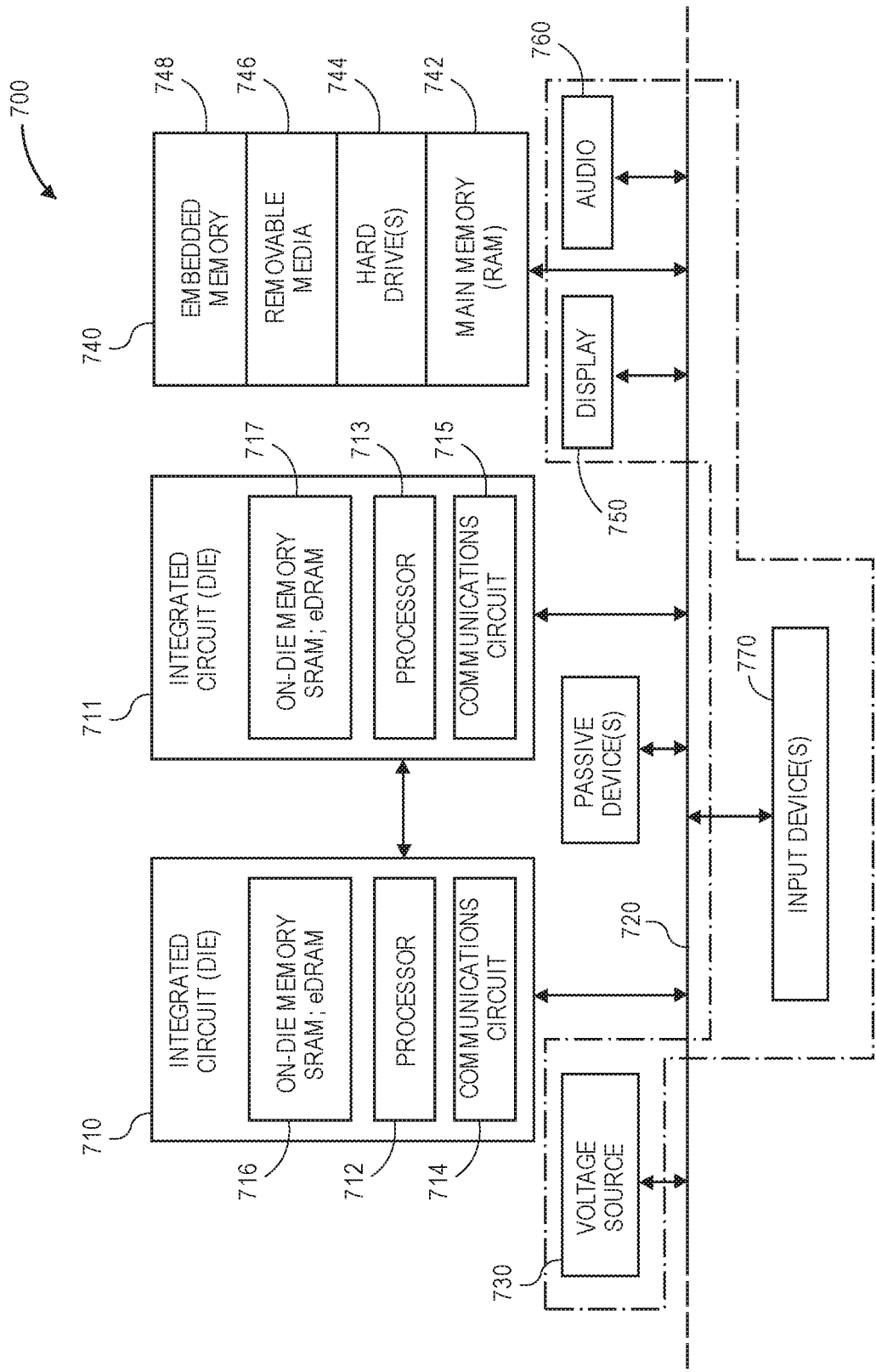
FIG. 7 is a schematic of a computer system, in accordance with an embodiment.

FIG. 7 is a schematic of a computer system, in accordance with an embodiment. The computer system 700 (also referred to as the electronic system 700) as depicted can embody a semiconductor package including a passive support wafer, according to any of the several disclosed embodiments and their equivalents as set forth in this disclosure. The computer system 700 may be a mobile device such as a netbook computer. The computer system 700 may be a mobile device such as a wireless smart phone. The computer system 700 may be a desktop computer. The computer system 700 may be a hand-held reader. The computer system 700 may be a server system. The computer system 700 may be a supercomputer or high-performance computing system.

In an embodiment, the electronic system 700 is a computer system that includes a system bus 720 to electrically couple the various components of the electronic system 700. The system bus 720 is a single bus or any combination of busses according to various embodiments. The electronic system 700 includes a voltage source 730 that provides power to the integrated circuit 710. In some embodiments, the voltage source 730 supplies current to the integrated circuit 710 through the system bus 720.

The integrated circuit 710 is electrically coupled to the system bus 720 and includes any circuit, or combination of circuits according to an embodiment. In an embodiment, the integrated circuit 710 includes a processor 712 that can be of any type. As used herein, the processor 712 may mean any type of circuit such as, but not limited to, a microprocessor, a microcontroller, a graphics processor, a digital signal processor, or another processor. In an embodiment, the processor 712 includes, or is coupled with, a semiconductor package including a passive support wafer, as disclosed herein. In an embodiment, SRAM embodiments are found in memory caches of the processor. Other types of circuits that can be included in the integrated circuit 710 are a custom circuit or an application-specific integrated circuit (ASIC), such as a communications circuit 714 for use in wireless devices such as cellular telephones, smart phones, pagers, portable computers, two-way radios, and similar electronic systems, or a communications circuit for servers. In an embodiment, the integrated circuit 710 includes on-die memory 716 such as static random-access memory (SRAM). In an embodiment, the integrated circuit 710 includes embedded on-die memory 716 such as embedded dynamic random-access memory (eDRAM).

In an embodiment, the integrated circuit 710 is complemented with a subsequent integrated circuit 711. Useful embodiments include a dual processor 713 and a dual communications circuit 715 and dual on-die memory 717 such as SRAM. In an embodiment, the dual integrated circuit 711 includes embedded on-die memory 717 such as eDRAM.

In an embodiment, the electronic system 700 also includes an external memory 740 that in turn may include one or more memory elements suitable to the particular application, such as a main memory 742 in the form of RAM, one or more hard drives 744, and/or one or more drives that handle removable media 746, such as diskettes, compact disks (CDs), digital variable disks (DVDs), flash memory drives, and other removable media known in the art. The external memory 740 may also be embedded memory 748 such as the first die in a die stack, according to an embodiment.

In an embodiment, the electronic system 700 also includes a display device 750, and an audio output 760. In an embodiment, the electronic system 700 includes an input device such as a controller 770 that may be a keyboard, mouse, trackball, game controller, microphone, voice-recognition device, or any other input device that inputs information into the electronic system 700. In an embodiment, an input device 770 is a camera. In an embodiment, an input device 770 is a digital sound recorder. In an embodiment, an input device 770 is a camera and a digital sound recorder.

As shown herein, the integrated circuit 710 can be implemented in a number of different embodiments, including a semiconductor package including a passive support wafer, according to any of the several disclosed embodiments and their equivalents, an electronic system, a computer system, one or more methods of fabricating an integrated circuit, and one or more methods of fabricating an electronic assembly that includes a semiconductor package including a passive support wafer, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed semiconductor packages including a passive support wafer embodiments and their equivalents. A foundation substrate may be included, as represented by the dashed line of FIG. 7. Passive devices may also be included, as is also depicted in FIG. 7.

Embodiments of a semiconductor package including a passive support wafer is described above. In an embodiment, a semiconductor package includes an active die wafer having a top surface. The semiconductor package includes a plurality of active dies mounted on the top surface of the active die wafer. The semiconductor package includes a passive support wafer mounted on the plurality of active dies over the top surface of the active die wafer. The passive support wafer includes a non-polymeric material.

In one embodiment, the passive support wafer is a monolith of the non-polymeric material.

In one embodiment, the passive support wafer has a passive support wafer thickness of less than 1 mm.

In one embodiment, the non-polymeric material is one or more of a metal, a ceramic, a silicon, or a synthetic diamond.

In one embodiment, the passive support wafer includes a bottom surface facing the top surface of the active die wafer. The top surface and the bottom surface have a same profile.

In one embodiment, the semiconductor package includes a bonding layer between the plurality of active dies and the passive support wafer.

In one embodiment, the bonding layer has a bonding layer thickness of 10-20 microns.

In one embodiment, the bonding layer includes one or more of a die attach adhesive or a solder.

In one embodiment, the semiconductor package includes an epoxy layer surrounding the plurality of active dies between the bonding layer and the active die wafer. The bonding layer physically separates the passive support wafer from the epoxy layer and the plurality of active dies. The bonding layer thermally couples the passive support wafer to the plurality of active dies.

In an embodiment, a semiconductor package assembly includes a printed circuit board. The semiconductor package assembly includes a semiconductor package mounted on the printed circuit board. The semiconductor package includes an active die wafer having a top surface, a plurality of active dies mounted on the top surface of the active die wafer, and a passive support wafer mounted on the plurality of active dies over the top surface of the active die wafer. The passive support wafer includes a non-polymeric material.

In one embodiment, the semiconductor package assembly includes a heat spreader over the passive support wafer. The semiconductor package assembly includes a thermal interface layer between the heat spreader and the passive support wafer. The thermal interface layer thermally couples the heat spreader to the passive support wafer.

In one embodiment, the passive support wafer is a monolith of the non-polymeric material.

In one embodiment, the passive support wafer has a passive support wafer thickness of less than 1 mm.

In one embodiment, the semiconductor package assembly includes a bonding layer between the plurality of active dies and the passive support wafer.

In one embodiment, the bonding layer has a bonding layer thickness of 10-20 microns.

In an embodiment, a method of fabricating a semiconductor package including a passive support wafer includes mounting a plurality of active dies on an active die wafer. The method includes mounting a passive support wafer on the plurality of active dies. The passive support wafer includes a non-polymeric material.

In one embodiment, the method includes processing a through-silicon-via in the active die wafer after mounting the passive support wafer on the plurality of active dies.

In one embodiment, mounting the passive support wafer on the plurality of active dies includes applying a bonding layer over the plurality of active dies, and placing the passive support wafer on the bonding layer.

In one embodiment, the passive support wafer has a passive support wafer thickness of less than 1 mm. The bonding layer has a bonding layer thickness of 10-20 mm.

In one embodiment, the method includes thinning the passive support wafer to the passive support wafer thickness.

What is claimed is:

1. A semiconductor package, comprising:
a package substrate having a lateral width;
an active die wafer coupled to the package substrate, the active die wafer having a lateral width less than the lateral width of the package substrate, the active die wafer having a top surface, and the active die wafer comprising one or more electronic circuits;
a plurality of active dies mounted on the top surface of the active die wafer, the plurality of active dies comprising a first active die laterally adjacent to a second active die on the top surface of the active die wafer; and
a passive support wafer mounted on the plurality of active dies over the top surface of the active die wafer, wherein the passive support wafer includes a non-polymeric material.

2. The semiconductor package of claim 1, wherein the passive support wafer is a monolith of the non-polymeric material.

3. The semiconductor package of claim 2, wherein the passive support wafer has a passive support wafer thickness of less than 1 mm.

4. The semiconductor package of claim 3, wherein the non-polymeric material is one or more of a metal, a ceramic, a silicon, or a synthetic diamond.

5. The semiconductor package of claim 1, wherein the passive support wafer includes a bottom surface facing the top surface of the active die wafer, and wherein the top surface and the bottom surface have a same profile.

6. The semiconductor package of claim 1 further comprising a bonding layer between the plurality of active dies and the passive support wafer.

7. The semiconductor package of claim 6, wherein the bonding layer has a bonding layer thickness of 10-20 microns.

8. The semiconductor package of claim 7, wherein the bonding layer includes one or more of a die attach adhesive or a solder.

9. The semiconductor package of claim 6 further comprising an epoxy layer surrounding the plurality of active dies between the bonding layer and the active die wafer, wherein the bonding layer physically separates the passive support wafer from the epoxy layer and the plurality of active dies, and wherein the bonding layer thermally couples the passive support wafer to the plurality of active dies.

10. A semiconductor package assembly, comprising:
a printed circuit board; and
a semiconductor package mounted on the printed circuit board, the semiconductor package including:
a package substrate having a lateral width;
an active die wafer coupled to the package substrate, the active die wafer having a lateral width less than the lateral width of the package substrate, the active die wafer having a top surface, and the active die wafer comprising one or more electronic circuits,
a plurality of active dies mounted on the top surface of the active die wafer, the plurality of active dies comprising a first active die laterally adjacent to a second active die on the top surface of the active die wafer, and
a passive support wafer mounted on the plurality of active dies over the top surface of the active die wafer, wherein the passive support wafer includes a non-polymeric material.

11. The semiconductor package assembly of claim 10 further comprising:
a heat spreader over the passive support wafer; and
a thermal interface layer between the heat spreader and the passive support wafer, wherein the thermal interface layer thermally couples the heat spreader to the passive support wafer.

12. The semiconductor package assembly of claim 10, wherein the passive support wafer is a monolith of the non-polymeric material.

13. The semiconductor package assembly of claim 12, wherein the passive support wafer has a passive support wafer thickness of less than 1 mm.

14. The semiconductor package assembly of claim 10 further comprising a bonding layer between the plurality of active dies and the passive support wafer.

15. The semiconductor package assembly of claim 14, wherein the bonding layer has a bonding layer thickness of 10-20 microns.

* * * * *